(12) United States Patent
Yang et al.

(10) Patent No.: US 6,882,574 B2
(45) Date of Patent: Apr. 19, 2005

(54) SINGLE POLY UV-ERASABLE PROGRAMMABLE READ ONLY MEMORY

(75) Inventors: Ching-Sung Yang, Hsin-Chu (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 35 days.

(21) Appl. No.: 10/605,235

(22) Filed: Sep. 17, 2003

(65) Prior Publication Data

US 2004/0109364 A1 Jun. 10, 2004

Related U.S. Application Data

(63) Continuation-in-part of application No. 10/055,047, filed on Jan. 25, 2002, now Pat. No. 6,678,190.

(51) Int. Cl.$^7$ .............................................. G11C 16/04
(52) U.S. Cl. .............................. 365/185.29; 365/185.32
(58) Field of Search ....................... 365/185.29, 185.32, 365/185.05, 185.14, 185.18, 185.27, 185.28

(56) References Cited

U.S. PATENT DOCUMENTS

| | | | | |
|---|---|---|---|---|
| 4,371,956 A | * | 2/1983 | Maeda et al. ........... | 365/185.21 |
| 4,665,503 A | * | 5/1987 | Glasser ................... | 365/185.32 |
| 6,128,232 A | * | 10/2000 | Keller et al. ............ | 365/185.29 |

* cited by examiner

*Primary Examiner*—Anh Phung
(74) *Attorney, Agent, or Firm*—Winston Hsu (57) ABSTRACT

An erasable programmable read only memory includes two serially connected P-type metal-oxide semiconductor (MOS) transistors, wherein a first P-type MOS transistor acts as select transistor, a gate of the first P-type MOS transistor is coupled to select gate voltage, a first node of the first P-type MOS transistor connected to source line voltage, a second node of the first P-type MOS transistor connected to a first node of a second P-type MOS transistor, wherein a second node of the second P-type MOS transistor is connected to bit line voltage, wherein a gate of the second P-type MOS transistor serves as a floating gate, wherein the erasable programmable read only memory does not need to bias a certain voltage on a control gate for programming and thereby injecting hot carriers onto the floating gate, and wherein the erasable programmable read only memory is capped by dielectric materials which are transparent to ultraviolet (UV) light.

9 Claims, 11 Drawing Sheets

SINGLE POLY UV-ERASABLE PROGRAMMABLE READ ONLY MEMORY

CROSS REFERENCE TO RELATED APPLICATIONS

This application is a continuation-in-part of U.S. patent application Ser. No. 10/055,047 filed on Jan. 25, 2002, now U.S. Pat. No. 6,678,190, issued on Jan. 13, 2004, by Ching-Sung Yang, Shih-Jye Shen and Ching-Hsiang Hsu, entitled "Single Poly Embedded EPROM".

BACKGROUND OF INVENTION

1. Field of the Invention

The present invention relates to a semiconductor memory device, and more specifically, to a single-poly UV-erasable electrically programmable read only memory device or a single-poly one-time programmable (OTP) memory device.

2. Description of the Prior Art

The semiconductor industry has been advanced to the field of Ultra Large Scale Integrated (ULSI) technologies. The fabrication of the nonvolatile memories also follows the trend of the size reduction of a unit device. Thanks to advantages such as non-volatility, fast access time and low power dissipation, non-volatile memory can be applied in portable handy equipments, solid-state camera, PC cards and so on. The nonvolatile memories include various types of devices, such as electrically alterable read only memory (EAROM), and electrically erasable programmable read only memory (EEPROM). Different types of devices have been developed for specific applications. These parts have been developed with a focus on the high endurance and high-speed requirements. EEPROM needs multi-layer of polysilicon and silicon dioxide, therefore, multi-masking are used during the fabrication, thereby increasing the time for manufacturing the devices. One of the present researches is focus on how to integrate the manufacture process to reduce the cost. One of the approaches is to integrate the memory process with the CMOS fabrication. Up to now, many approaches toward to the formation of the EPROM and EEPROM by using one single poly process. In such technique, an indispensable control gate is buried in silicon bulk by ion implantation for capacitively coupling an overlying polysilicon floating gate.

A prior art that relates to the field is U.S. Pat. No. 6,174,759 filed May 3, 1999, by Verhaar et al., entitled "Method of manufacturing a semiconductor device", assigned to U.S. Philips Corporation (New York, N.Y.). U.S. Pat. No. 6,174,759 disclosed a process that can integrate with the CMOS process. U.S. Pat. No. 6,191,980 filed May 31, 2000, assigned to Lucent Technologies, Inc., discloses a single poly EEPROM. The device includes a control device, a switch device and an erase device, all of which share a common polysilicon floating gate that is designed to retain charge in the programmed memory cell. The memory cell can be safely erased without risking the junction breakdowns. U.S. Pat. No. 6,044,018 filed Jun. 17, 1998, assigned to Mosel Vitelic, Inc. (Hsinchu, T W), entitled "Single-poly flash memory cell for embedded application and related methods" discloses a single poly memory. U.S. Pat. No. 6,044,018 discloses a single-poly flash memory cell manufacturable by a standard CMOS fabrication process. A NMOS floating gate is electrically connected to a PMOS floating gate.

In the article IEEE transaction on electron device, Vol. 37, No. 3, March 1990 p. 675, in which disclosed single poly-Si EEPROM. The structure includes an embedded control gate that is formed by ion implantation. The cell includes separated transistor and coupled capacitor and can be manufacturable by standard CMOS process. The further technique that can be compatible with the CMOS can be found in IEEE JOURNAL OF SOLID STATE CIRCUITS, Vol. 29, No. 3, 1994, p. 311. The structure includes NMOS and PMOS, the inversion layer under the PMOS gate and p+ doped region act as the control gate. When positive voltage applies to the p+ doped region, the voltage level of the floating gate determines the capacitance ratio of the NMOS and PMOS. The art may be formed by standard CMOS process. The structure refers to SIPPOS (single poly pure CMOS).

Figure 1:
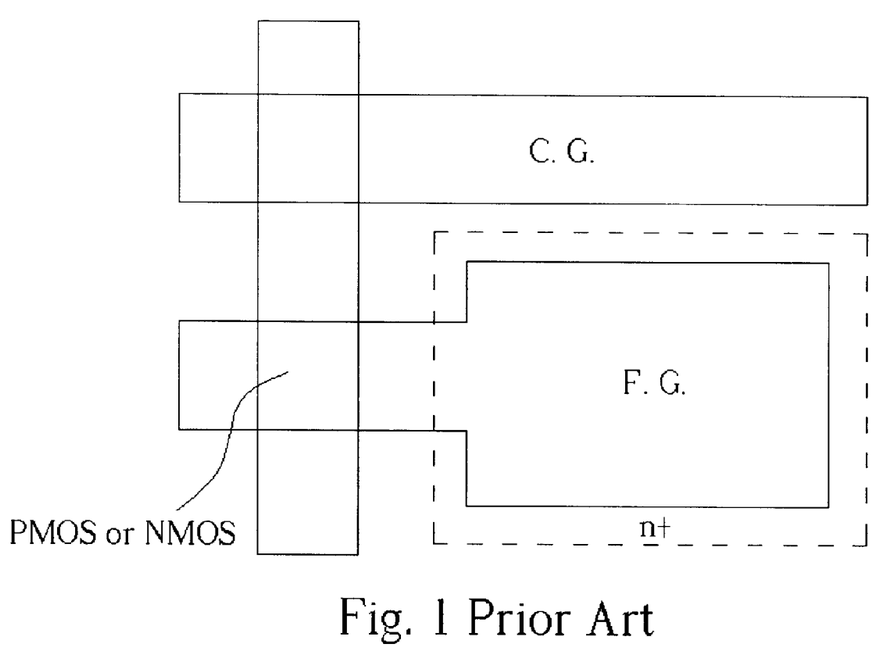
FIG. 1 shows a layout according to the prior art.
Figure 2:
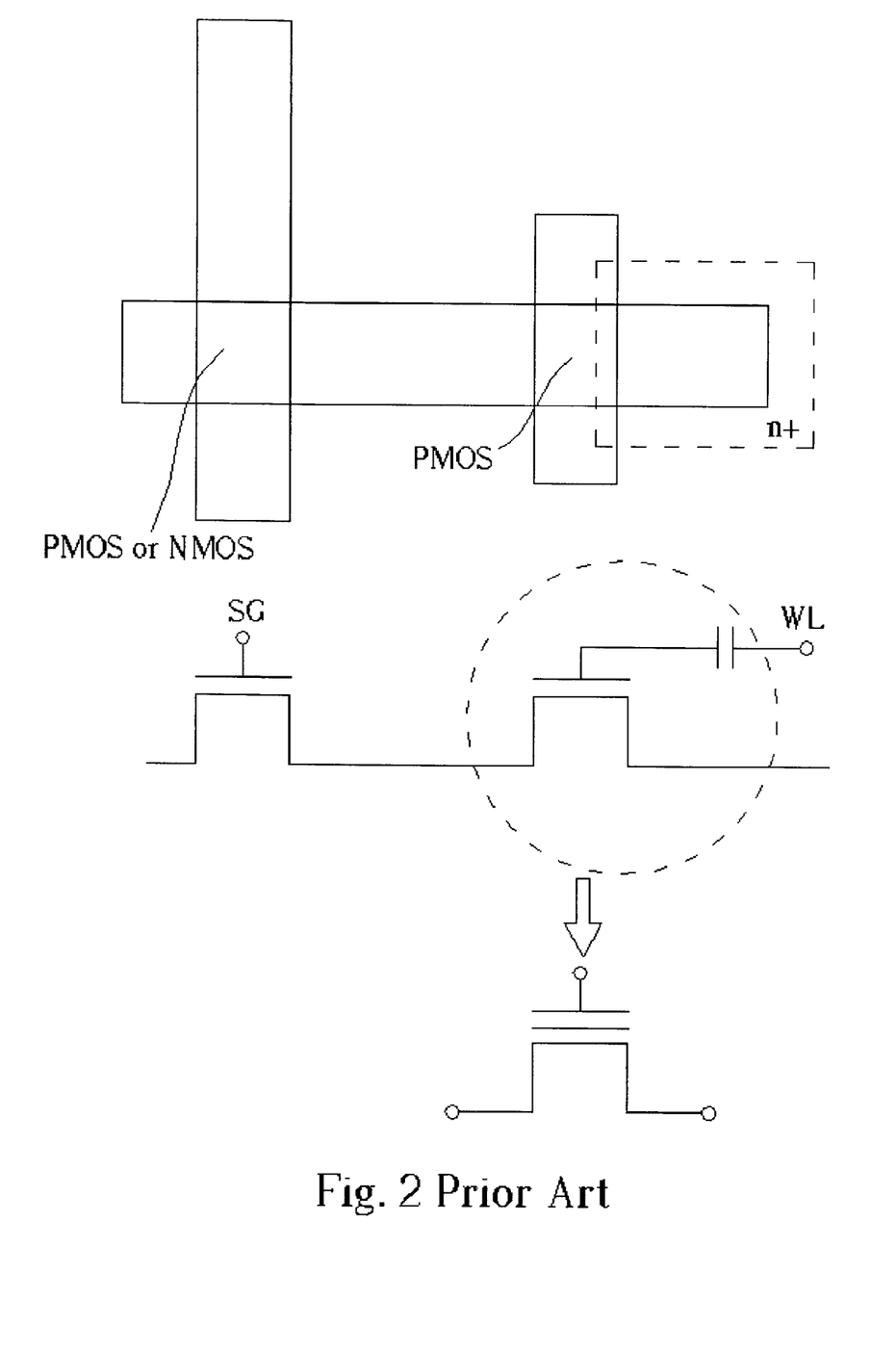
FIG. 2 shows another layout according to the prior art.

FIG. 1 shows the layout of prior single poly non-volatile memory, the structure includes n+ doped region under the floating gate and buried in the substrate. The structure occupies too much area. FIG. 2 shows another type of layer according to the prior art. The structure is consisted of a capacitor and a PMOS. The technique has to provide space for forming the capacitor.

SUMMARY OF INVENTION

One object of the present invention is to provide a nonvolatile memory or one-time programmable (OTP) memory. One of the features includes that the device consists of two serial connected P-type metal-oxide-semiconductor transistors.

From one aspect of the claimed invention, an erasable programmable read only memory comprises two serially connected P-type metal-oxide semiconductor (MOS) transistors. Wherein a first P-type metal-oxide semiconductor transistor acts as a select transistor, a second P-type metal-oxide semiconductor transistor, wherein a gate of the second P-type metal-oxide semiconductor transistor serves as a floating gate, biasing a drain of the second P-type metal-oxide semiconductor transistor to a first negative bias, thereby providing a second negative bias on the floating gate to perform programming mode without applying a certain bias on a control gate.

Another aspect of the claimed invention presents an erasable programmable read only memory eliminating a buried control gate underlying the single-poly floating gate. A first conductive area is covered on the substrate and forms a first cross structure with a first overlap area to act as a select transistor gate and is connected to a select gate voltage ($V_{SG}$). A second conductive region located at side of the first conductive region and on the substrate and forms a second cross structure with a second overlap area to act as a floating gate. Wherein a feature of the erasable programmable read only memory is that a control gate is omitted, thereby reducing device size and the process is compatible with CMOS process.

An erasable programmable read only memory includes two serially connected P-type metal-oxide semiconductor (MOS) transistors, wherein a first P-type MOS transistor acts as select transistor, a gate of the first P-type MOS transistor is coupled to select gate voltage, a first node of the first P-type MOS transistor connected to source line-voltage, a second node of the first P-type MOS transistor connected to a first node of a second P-type MOS transistor, wherein a second node of the second P-type MOS transistor is connected to bit line voltage, wherein a gate of the second P-type MOS transistor serves as a floating gate, wherein the erasable programmable read only memory does not need to bias a certain voltage on a control gate for programming and thereby injecting hot carriers onto the floating gate, and wherein the erasable programmable read only memory is capped by dielectric materials which are transparent to ultraviolet (UV) light.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention proposes a novel memory device and the method for fabricating the same. The aspect of the present invention includes two serially connected PMOS transistors. The characteristic of the devices is that bias is not necessary to apply on the floating gate during the programming mode. Thus, the control gate is omitted for the structure or layout, thereby saving the space for making the control gate. The present invention may "automatically inject" carrier onto floating gate for programming the status of the device. The term "automatically inject" refers to that the device does not need to apply bias on the control gate for programming. The present invention uses PMOS transistors, therefore the device can be formed by using standard CMOS process.

Figure 3:
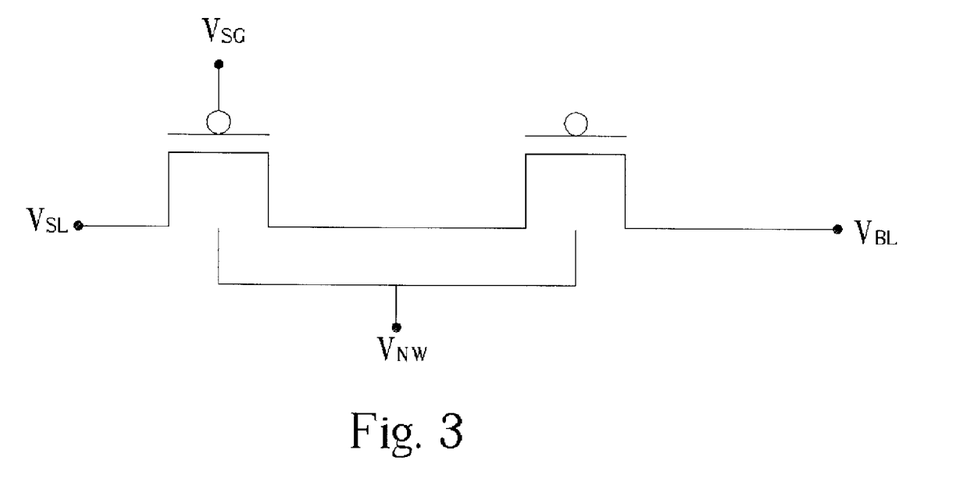
FIG. 3 shows the circuit according to the present invention.

The detail description of the method will be seen as follows. Turning to FIG. 3, it shows the circuit according to the present invention. The device includes two serially connected PMOS transistors, wherein the first PMOS transistor is used as select transistor and the gate of the transistor is connected to the select gate voltage ($V_{SG}$). The first terminal (source) of the first PMOS transistor is biased to source line voltage ($V_{SL}$), and the second terminal (drain) is connected to the first terminal of the second PMOS transistor. The second terminal of the second PMOS transistor is connected to the bit line voltage ($V_{BL}$). The N-well (NW) of the two serially connected PMOS transistors is biased to an N-well voltage ($V_{NW}$). The gate of the second PMOS transistor acts as the floating gate. It has to be noted that the cell according to the present invention omits the control gate compared to the prior art. The channel hot carrier will inject onto the floating gate by applying suitable bias.

Figure 4:
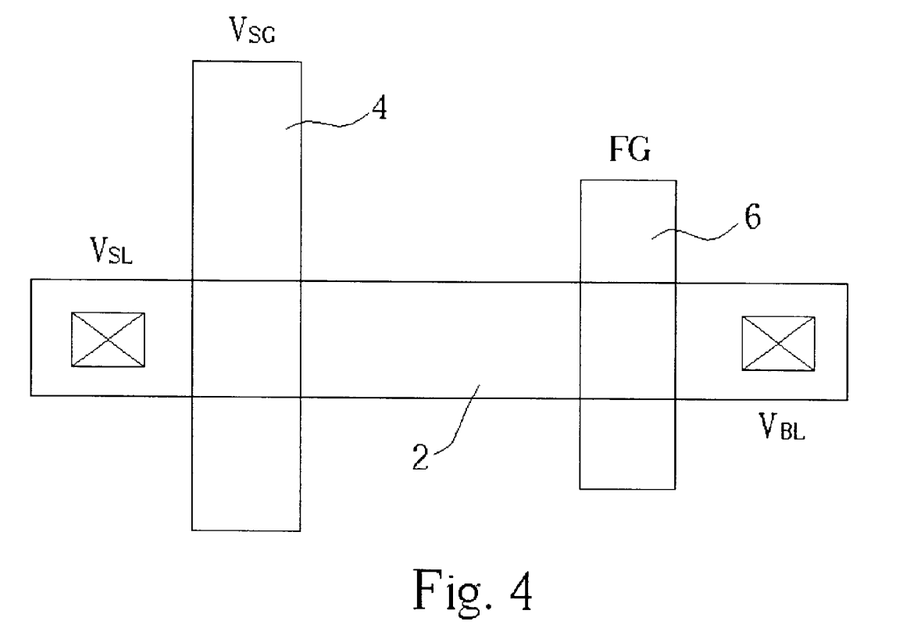
FIG. 4 illustrates a layout according to the present invention.

FIG. 4 shows the EPROM layout of the present invention, the device includes a doped region 2 (lateral configuration area in the drawing). Typically, the doped region can be formed by ion implantation, the doped region 2 can be shaped with stripe structure. A first conductive area 4 and a second conductive area 6 are covered on the substrate and form cross configuration structure with overlap area to act as selecting transistor gate and floating gate. The gate of the selecting transistor comprises a stripe structure and is connected to selecting gate voltage ($V_{SG}$). One of the aspects of the present invention is that the control gate is omitted, therefore, the present invention may reduce the device size, meet the requirement of the IC trend and integrate with CMOS process. The bit line and contact window of the selecting line can be formed and aligned to the doped region 2 by using lithography and etching process.

The second conductive area 6 locates at the side of the first conductive area 4 and on the substrate forms cross configuration structure with overlap area to act as floating gate. The programming operation is achieved by using channel hot electron injection (CHE) and the floating gate is charged by hot electrons in the programming state, the voltage level of the floating gate is less than ground level. The device cell keeps "turn on". During the erase mode, the digital states may be altered by exposing ultra violate (UV) ray. After erasing, there is no electron charge in the floating gate. To implement UV erasing operation, the OTP memory array and its peripheral control circuit of this invention is covered with dielectric materials that are UV transparent. Such UV transparent materials may include silicon oxynitride, silicon dioxide, very thin silicon nitride, and the like. It is understood that number of layers of UV transparent dielectric above the OTP memory array also depends on the metal interconnection level.

Figure 9:
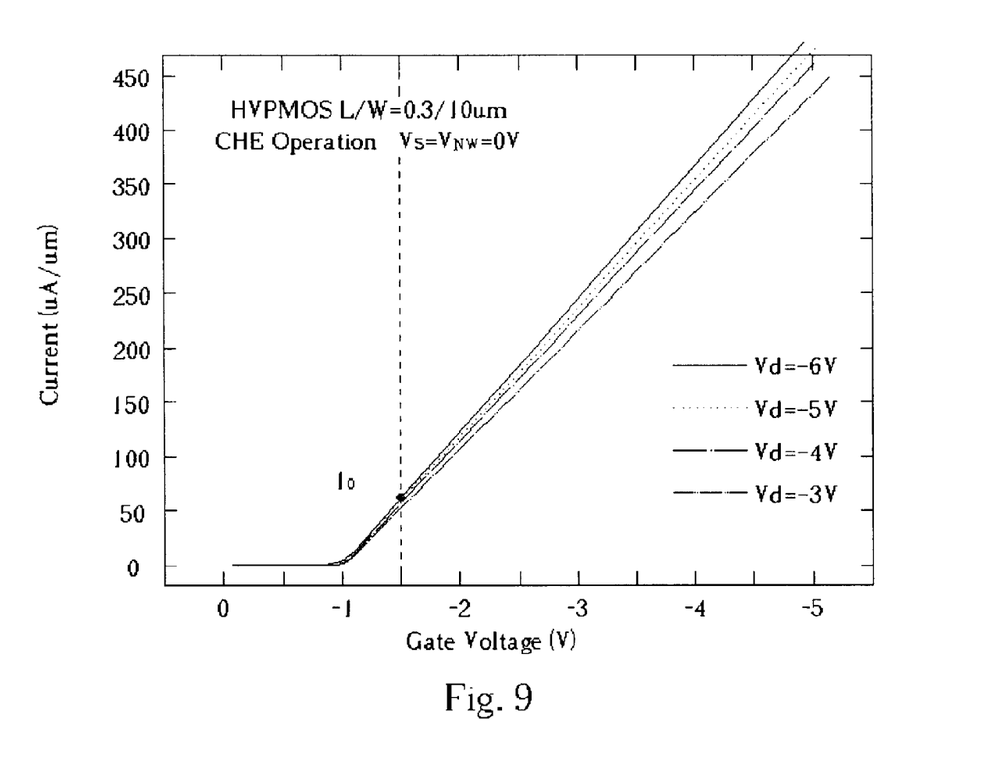
FIG. 9 shows the drain current-voltage drawing according to the present invention.
Figure 10:
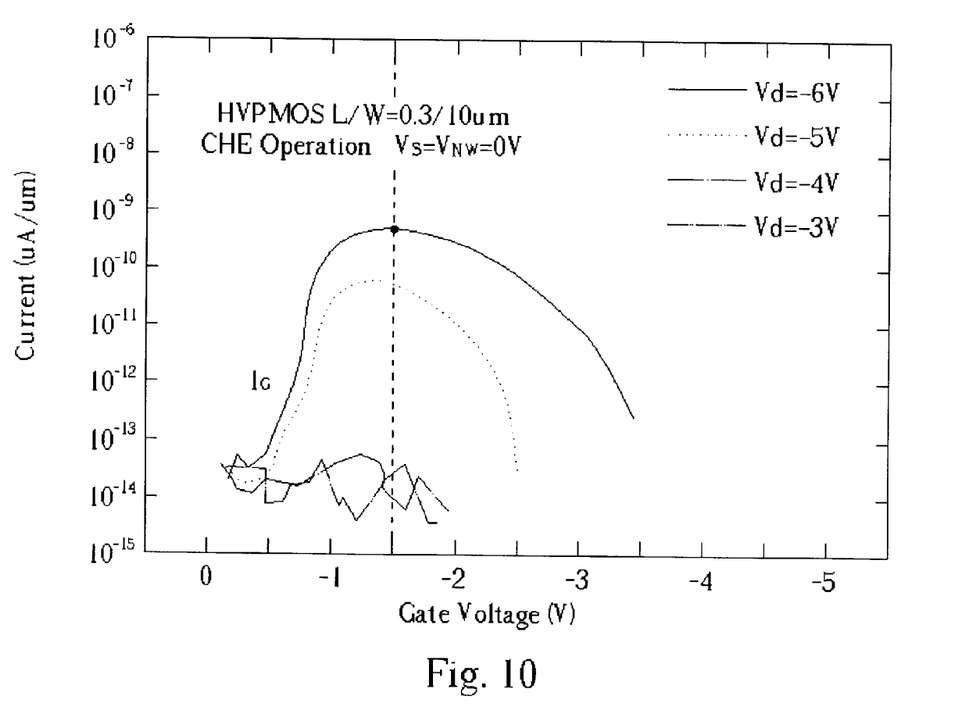
FIG. 10 shows the gate current-voltage drawing according to the present invention.

FIG. 9 illustrates the drain current-voltage characteristic and FIG. 10 shows the gate current-voltage characteristic. In FIG. 10, the drain bias is negative five or six volts. At the current peak value of the gate current, the PMOS gate bias is about negative one volt. Under such circumstance, the carrier will inject onto the floating gate automatically without applying bias on the floating gate. Thus, the control gate is omitted. The term "automatically inject" refers to that the device does not need to apply bias on the control gate for programming. With going down of the floating gate bias, the programming mode is then "turned off". The higher $I_G/I_D$ efficient can be obtained with lower power consumption.

Figure 5:
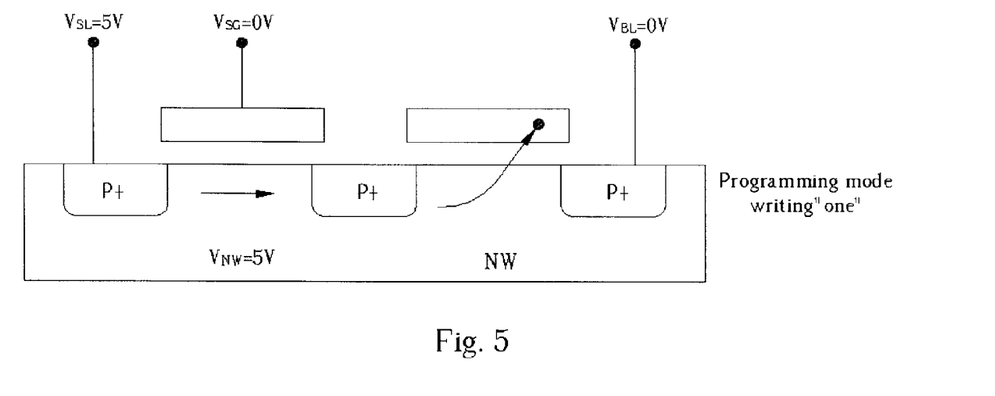
FIG. 5 is a cross sectional view of a substrate illustrating the programming mode of writing the status "1" according to the present invention.
Figure 6:
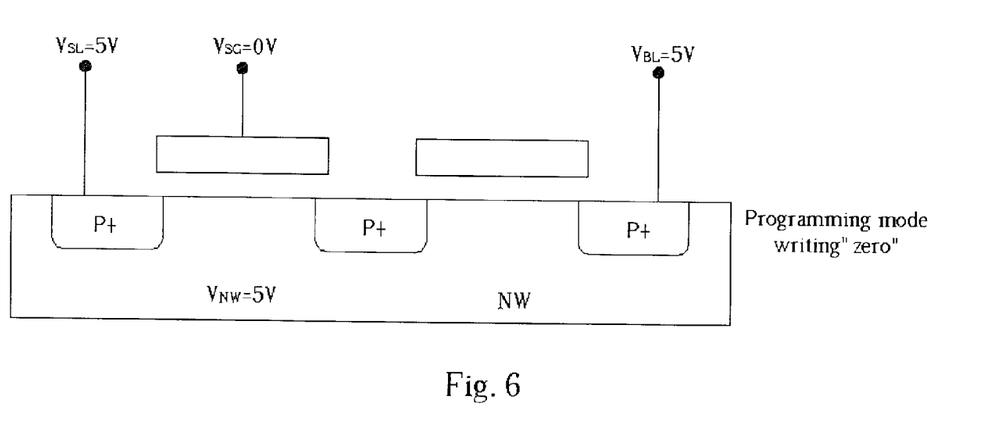
FIG. 6 is a cross sectional view of a substrate illustrating the programming mode of writing the status "0" according to the present invention.

The conditions for writing "digital one" and "digital zero" may refer to Table one and FIGS. 5 and 6. During the mode for writing "digital one", the selected word line is grounded ($V_{SG}$=0V) and the unselected word line is ranging from 3–8 volts, preferably about five volts. The selected bit line is grounded ($V_{BL}$=0V) and the bias of the unselected bit line is ranging from 3–8 volts, preferably five volts. The source node is biased to a source line voltage ($V_{SL}$) of 3–8 volts, and the N well (NW) is biased to an N well voltage of 3–8 volts. The PMOS transistor of the selected transistor turns on and the hot channel electron injects onto the floating gate of the second transistor.

During the mode for writing "digital zero", the selected word line is grounded ($V_{SG}$=0V) and 3–8 volts is biased to the unselected word line. The selected bit line voltage ($V_{BL}$) is ranging from 3–8 volts, preferably 5 volts, and the unselected bit line voltage is ranging from 3–8 volts. The source node and N well (NW) are respectively connected to 3–8 volts. The device is under the status of "off" and therefore the hot carrier is unable to inject into the floating gate.

Figure 7:
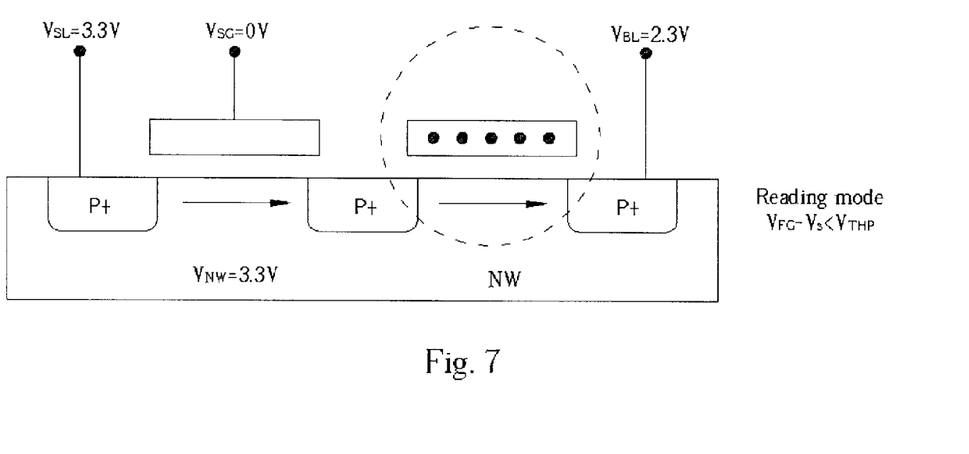
FIGS. 7 and 8 are cross sectional views of a substrate illustrating the reading mode according to the present invention.
Figure 8:
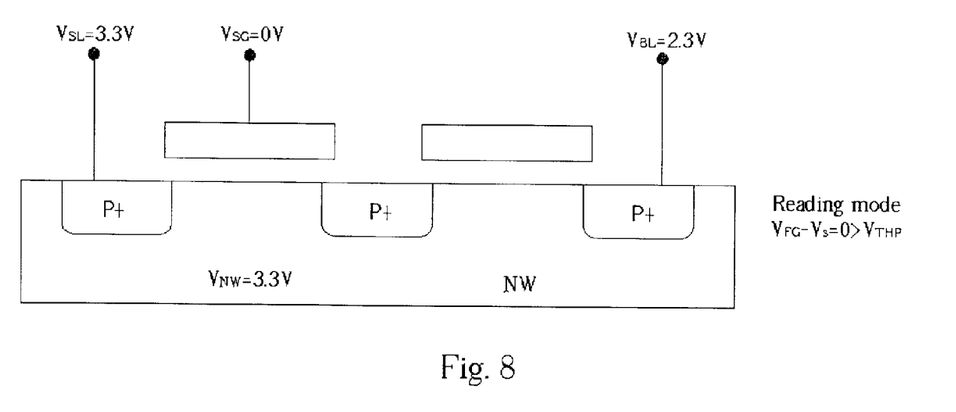

In the read operation, referring to FIGS. 7 and 8, the selected word line is grounded ($V_{SG}$=0V). The unselected word line is biased to 2.5–5 volts and selected bit line voltage ($V_{BL}$) is ranging from 0–2.5 volts. The unselected bit line is biased to 3.3 volts. The source node is also biased to 2.5–5 volts. N well (NW) is connected to 2.5–5 volts (eg. $V_{NW}$=3.3V). If the cell is programmed, the floating gate is charged with carrier, then $V_{FG}-V_S<V_{THP}$ (threshold voltage of PMOS), the device maintains at the status of "ON". The floating gate of those unprogrammed cells have no charge therein, then $V_{FG}-V_S=0>V_{THP}$ (threshold voltage of PMOS), the device at the status of "OFF".

As aforementioned, the device does not need the control gate for programming. The floating gate may self-charge to define the digital status. The feature of the present invention includes: the device can be manufacturable by standard CMOS process. The space for forming the control gate can be omitted, thereby reducing the layout area.

Figure 11:
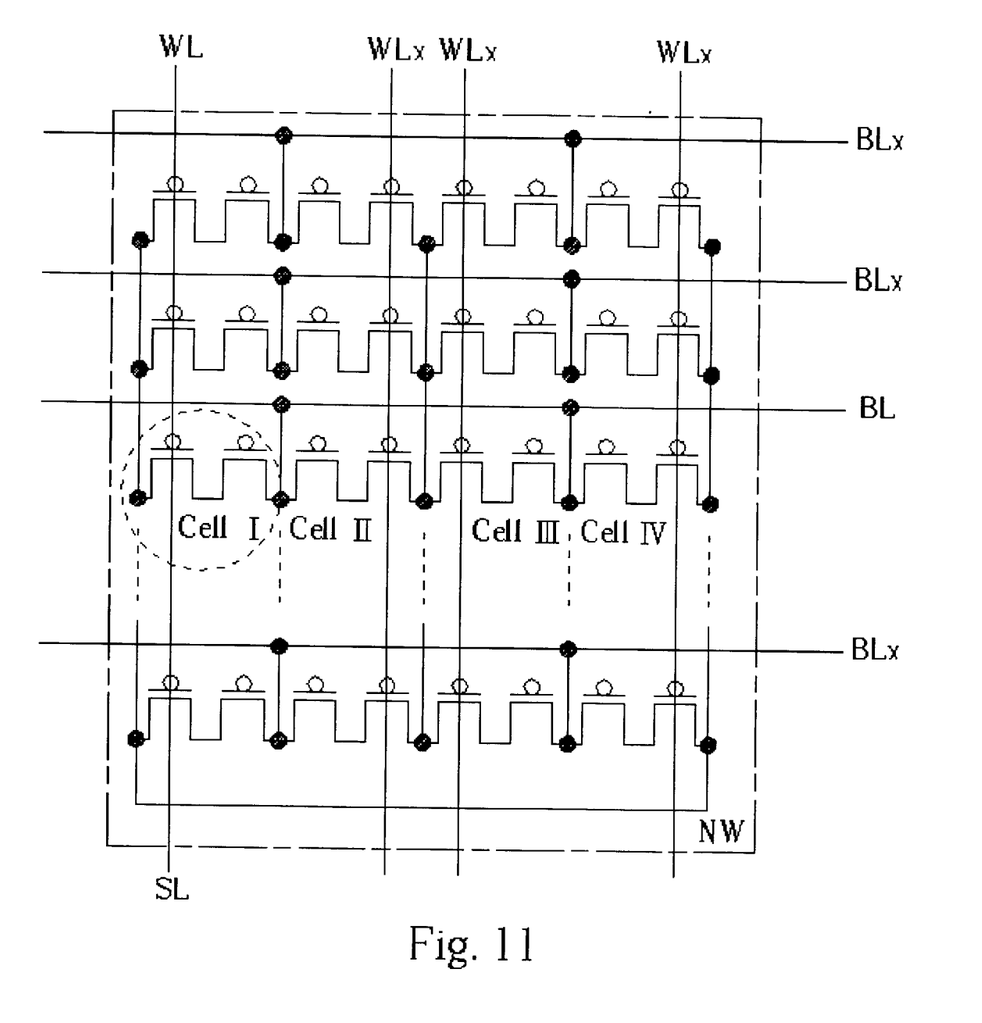
FIG. 11 illustrates the memory cell array according to the present invention.

FIG. 11 illustrates the cell array. In cell I, in the mode for writing "digital one", the drain is biased to five or six volts and the gate of select transistor is connected to ground. Other cells (cell II, cell III and cell IV) that are not under programming on the same bit line do not suffer the drain disturbance that typically occurs at stacked gate memory, it is because that the transistor is at off-state and the electric field between the drain and floating gate is not strong enough to inject/generate hot carrier. Further, the potential coupling of the floating gate is not induced by the word line, thereby eliminating the gate disturbance phenomenon.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

TABLE ONE

| Operation | Select WL | Unselect WL | Select BL | Unselect BL | Source line | N-well |
|---|---|---|---|---|---|---|
| Write one | 0 V | 5 V | 0 V | 5 V | 5 V | 5 V |
| Write zero | 0 V | 5 V | 5 V | 5 V | 5 V | 5 V |
| Read | 0 V | 33 V | 23 V | 33 V | 33 V | 33 V |

While the preferred embodiment of the invention has been illustrated and described, it will be appreciated that various changes can be made therein without departing from the spirit and scope of the invention.

What is claimed is:

1. An erasable programmable read only memory comprising:

two serially connected P-type metal-oxide semiconductor (MOS) transistors, wherein a first P-type MOS transistor acts as select transistor, a gate of said first P-type MOS transistor is coupled to select gate voltage, a first node of said first P-type MOS transistor is connected to source line voltage, a second node of said first P-type MOS transistor is connected to a first node of a second P-type MOS transistor, wherein a second node of said second P-type MOS transistor is connected to bit line voltage, wherein a gate of said second P-type MOS transistor serves as a floating gate, wherein said erasable programmable read only memory does not need to bias a certain voltage on a control gate for programming and thereby injecting hot carriers onto said floating gate, and wherein said erasable programmable read only memory is capped by dielectric materials which are transparent to ultraviolet (UV) light.

2. The erasable programmable read only memory of claim 1 wherein during an erase mode, carriers stored in said floating gate are removed by exposing to UV light and said UV light irradiates said floating gate through said dielectric materials capped on said erasable programmable read only memory.

3. The erasable programmable read only memory of claim 2 wherein said dielectric materials comprise silicon oxynitride.

4. The erasable programmable read only memory of claim 2 wherein said dielectric materials comprise silicon dioxide.

5. The erasable programmable read only memory of claim 2 wherein said dielectric materials comprise any material that is UV-transparent.

6. An erasable programmable read only memory comprising:

two serially connected P-type metal-oxide semiconductor (MOS) transistors, wherein a first P-type MOS transistor acts as select transistor, a gate of said first P-type MOS transistor is electrically coupled to select gate voltage, a first node of said first P-type MOS transistor is connected to source line voltage, a second node of said first P-type MOS transistor is connected to a first node of a second P-type MOS transistor, wherein a second node of said second P-type MOS transistor is connected to bit line voltage, wherein a gate of said second P-type MOS transistor serves as a floating gate, wherein said erasable programmable read only memory is capped by dielectric materials which are transparent to ultraviolet light.

7. The erasable programmable read only memory of claim 6 wherein said erasable programmable read only memory does not need to bias a certain voltage on a control gate for programming and thereby injecting hot carriers onto said floating gate.

8. The erasable programmable read only memory of claim 6 wherein during an erase mode, carriers stored in said floating gate are removed by exposing said floating gate to UV light irradiation and said UV light irradiates said floating gate through said dielectric materials capped on said erasable programmable read only memory.

9. The erasable programmable read only memory of claim 6 wherein said dielectric materials comprise any material that is UV-transparent.

* * * * *